United States Patent [19] [11] 4,228,542
Misawa et al. [45] Oct. 14, 1980

[54] DIGITAL TUNING FM STEREOPHONIC RECEIVER INCLUDING PHASE LOCKED LOOP SYNTHESIZER

[75] Inventors: Akira Misawa; Tatsuo Numata, both of Tokyo, Japan

[73] Assignee: Pioneer Electronic Corporation, Tokyo, Japan

[21] Appl. No.: 951,820

[22] Filed: Oct. 16, 1978

[30] Foreign Application Priority Data

Oct. 17, 1977 [JP] Japan ............ 52-123442
Oct. 21, 1977 [JP] Japan ............ 52-125849

[51] Int. Cl.[3] ............ H04B 1/26; H03J 5/00
[52] U.S. Cl. ............ 455/174; 455/175; 455/183; 455/185; 455/194
[58] Field of Search ............ 325/453, 455, 459, 464, 325/468, 470, 419, 456, 457, 478; 358/191

[56] References Cited

U.S. PATENT DOCUMENTS

| | | | |
|---|---|---|---|
| 3,937,972 | 2/1976 | Snell | 325/452 |
| 3,953,800 | 4/1976 | Nakamura et al. | 325/455 |
| 3,962,641 | 6/1976 | Suwa | 325/455 |
| 4,015,253 | 3/1977 | Goldstein | 325/455 |
| 4,117,407 | 9/1978 | Kusakabe | 325/468 |
| 4,131,853 | 12/1978 | Dreiske | 325/459 |
| 4,170,760 | 10/1979 | Umeda | 325/456 |

FOREIGN PATENT DOCUMENTS

| | | | |
|---|---|---|---|
| 2813728 | 10/1978 | Fed. Rep. of Germany | 325/464 |

*Primary Examiner*—Marc E. Bookbinder
*Attorney, Agent, or Firm*—Sughrue, Rothwell, Mion, Zinn & Macpeak

[57] ABSTRACT

A digital tuning FM stereophonic receiver of the type including a phase locked loop synthesizer. A digital code generating circuit is provided for generating a digital code which consists of several bits to be applied to a programmable frequency divider inserted in the phase locked loop. At least one auxiliary bit is provided together with the bits of the digital code. The information of the auxiliary bit is used to input and hold the digital code to be applied thereto. Muting operation of the FM stereophonic receiver is controlled in accordance with the information of the auxiliary bit.

10 Claims, 6 Drawing Figures

D G E F 1 32 4 31-2 29 31-1 D' 30

8
10-1
VC2
11
RF AMP
10-2
VC3
10-3
VC4
12
MIX
1A
9
VC1
20
IF
21
BUFFER
22
DET
23
MPX
24L
13R
L-OUT
R-OUT
26
+B
28
SWT. CIR.
33
f0
13
BUFFER
14
1/P
15
1/N
DIGITAL CODE
19
18
LOW PASS
16
COMP.
fr
17
FREQ. GEN.

DIGITAL TUNING FM STEREOPHONIC RECEIVER INCLUDING PHASE LOCKED LOOP SYNTHESIZER

BACKGROUND OF THE INVENTION

This invention relates to a digital tuning receiver of the type including a phase locked loop (hereinafter referred to as "PLL") synthesizer. In particular, it relates to a receiver wherein a tuning operation can be correctly carried out and a muting operation can be correctly carried out in accordance with the tuning operation.

Radio receivers of the type including PLL synthesizers have been extensively used in FM stereophonic receivers. In a digital tuning device for a PLL synthesizer, it is necessary to generate a digital code adapted to determine the frequency division number of a programmable frequency divider inserted in the PLL. Heretofore, for this purpose, a purely electronic method employing the combination of an up-down counter, a multivibrator, etc, has been proposed. Also a method using a memory board, such as a punch card, for storing binary information and a sensor for sensing the binary information out of the memory board have been studied. However, the former method is disadvantageous in that it is necessary to provide an upper and lower limit detecting circuit. As a result the manufacturing cost becomes higher than that of the latter method. In terms of the manufacturing cost, the digital tuning device according to the latter method is preferrable; however, it is still disadvantageous in the following aspects.

These will be described with reference to FIG. 1. A digital code storage perforated board 1 has perforations 3 through which light from a light source 2 passes to give a predetermined digital code to photo-transistors 6-1 through 6-N on a photo-transistor holder 4. The perforated board 1 may be planar as shown in FIG. 1 (*a*) or cylindrical; that is, the configuration of the perforated board 1 can be selected appropriately in accordance with the situation. When the photo-transistor holder is, for instance, in the position where the photo-transistors thereon face the line A or B of the perforated board 1, operation proceeds; that is, the relevant digital code can be sensed corresponding to its position without difficulty. However, when the photo-transistor holder is in the position where the photo-transistors thereon face the line C between the lines A and B, all of the bits of the digital code may be at an "L" level or the digital codes on both the lines A and B may be sensed.

In order to solve this problem, a method has been proposed in which a click board 5 is disposed below the perforated board 1 and a leaf spring 9 abutting against the teeth of the click board 5 is secured to the holder 4. By this technique, the photo-transistors 6 are moved only to predetermined positions. However, where this method is applied to a radio receiver, it is difficult to obtain the feeling of smooth operation which has been conventionally provided by the combination of a tuning knob and a flywheel. In addition, the method is disadvantageous in that the distance of digital pointer movement is shortened because the inertia of the flywheel is shortened. Hence the tuning operation becomes inconvenient.

Further, in a FM stereophonic receiver employing such a digital code generating method, a requirement exists to provide a muting circuit operating to open a gate only when the sensor faces a code on the perforated board and to correctly close the gate when the sensor is, for instance, placed between adjacent codes.

SUMMARY OF THE INVENTION

Accordingly, an object of this invention is to provide an FM stereophonic receiver of the type including the PLL synthesizer, in which the above-described drawbacks are completely eliminated.

It is another object of this invention to provide for an FM receiver in which digital codes may be used in a system that is reliable and inexpensive.

Briefly stated, in accordance with this invention, the digital code can be correctly applied to a programmable frequency divider inserted in the PLL and the tuning operation can be carried out with the feeling of smooth operation similarly to a conventional receiver. Furthermore, the tuning operation of the FM stereophonic receiver is correctly carried out.

BRIEF DESCRIPTION OF THE DRAWINGS

In the drawings:

FIG. 3(*b*) is a sectional view taken along line D-D in FIG. 3(*a*)

DETAILED DESCRIPTION OF A PREFERRED EMBODIMENT

Figure 2:
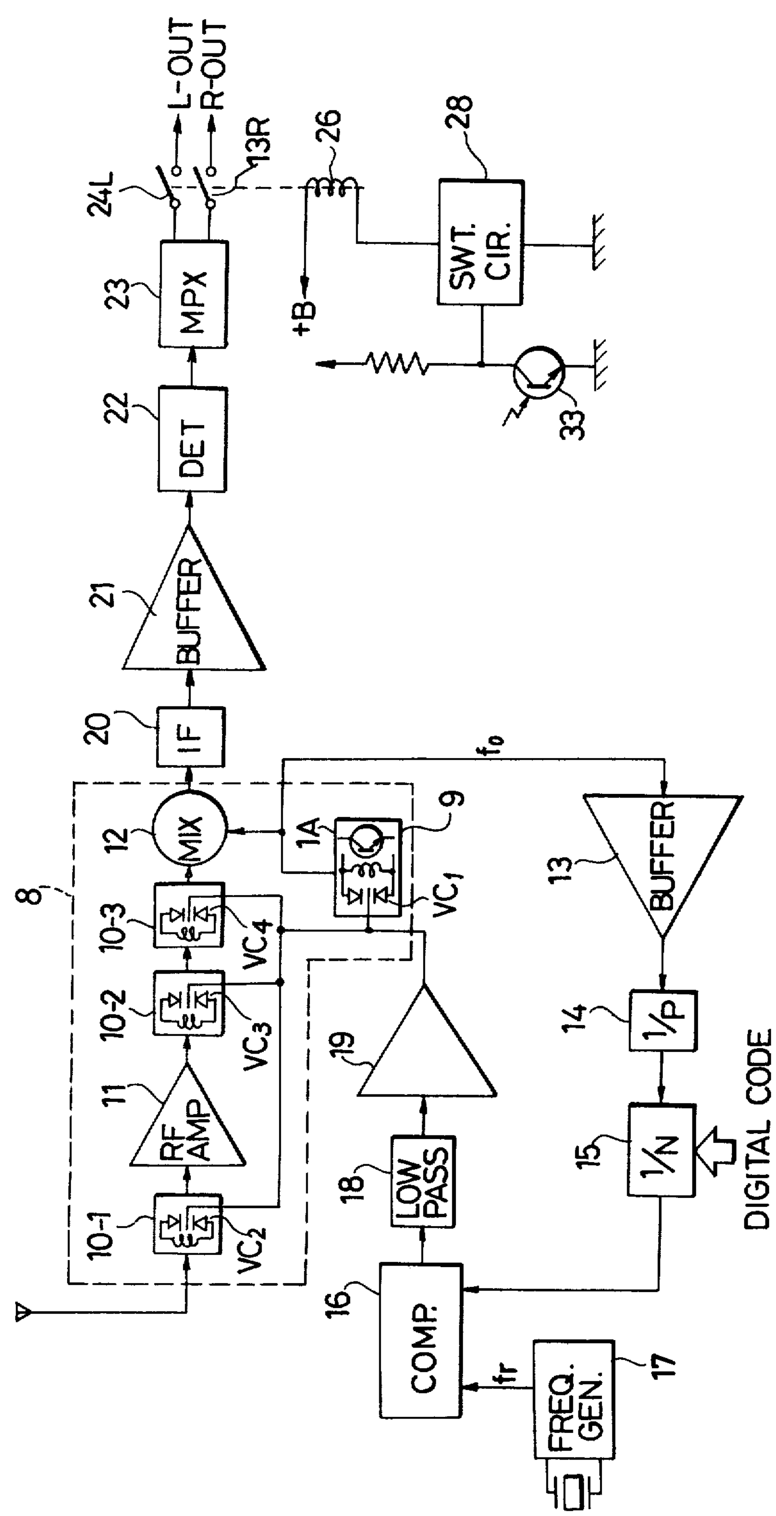
FIG. 2 is a block diagram illustrating a PII synthesizer FM stereophonic receiver.

One preferred embodiment of this invention will now be described with reference to FIGS. 2 through 4. A front end 8 is encircled by the dotted line in FIG. 2. The front end 8 comprises a voltage-controlled local oscillator 9 employing a voltage-dependable variable reactance element VC1, high-frequency selection tuning circuits 10-1 through 10-3 employing voltage-dependable variable reactance elements VC2 through VC4, respectively, and an RF amplifier 11. The input of the RF amplifier 11 is connected to the output of the high-frequency selection tuning circuit 10-1. A mixer 12 is used for mixing signals from the local oscillator 9 and the high-frequency selection tuning circuit 10-3.

The output frequency $f_0$ of the voltage-controlled local oscillator 9 is applied through a buffer circuit 13 to a prescaler 14, where it is subjected to 1/P frequency division. The output frequency thus frequency-divided is further subjected to 1/N frequency division in a programmable frequency divider 15 and is then applied to one of the input terminals of a phase comparator 16. A reference frequency $f_r$ obtained from a reference frequency generator 17 using a crystal oscillator or the like is applied to the other input terminal of the phase comparator 16, where the frequency $f_0/PN$ is compared with the reference frequency $f_r$.

Because of the characteristics of the PLL, 1/NP of the output frequency $f_0$ of the voltage-controlled local oscillator 9 acts to be synchronous with the reference frequency $f_r$. Accordingly, a local oscillation output frequency $f_0 = N\ P\ f_r$ is obtained as an output of the voltage-controlled local oscillator 9. In FIG. 2, elements 18 and 19 designate a low-pass filter and an amplifier, respectively. With the reference frequency $f_r$ and the frequency division number P of the prescaler 14 being constant, a desired output frequency $f_0$ can be obtained by appropriately selecting the frequency division number N of the programmable frequency divider 15.

The control voltage applied to the voltage-controlled local oscillator 9 is also applied to the voltage-dependable variable reactance elements $VC_2$ through $VC_4$ in the high-frequency selection tuning circuits 10-1 through 10-3, to thereby vary the tuning frequency. By suitably selecting the frequency division number N to be given to the programmable frequency divider 15, a particular broadcast radio wave can be received. The high frequency signal is mixed with the local oscillation signal of the voltage-controlled local oscillator 9 in the mixer 12. The output is applied through an intermediate frequency selecting circuit 20 and a buffer circuit 21 to an FM detecting circuit 22. The output of the FM detecting circuit 22 is applied to an MPX circuit 23, where it is separated into a left signal L and a right signal R which are applied through muting switches 24L and 24R to output terminals L-out and R-out, respectively. The muting switches 24L and 24R are actuated by a relay coil 26 to which current is applied by a switch circuit 28. The switch circuit 28 is energized when a photo-transistor 33 receives a light signal.

Figure 3A:
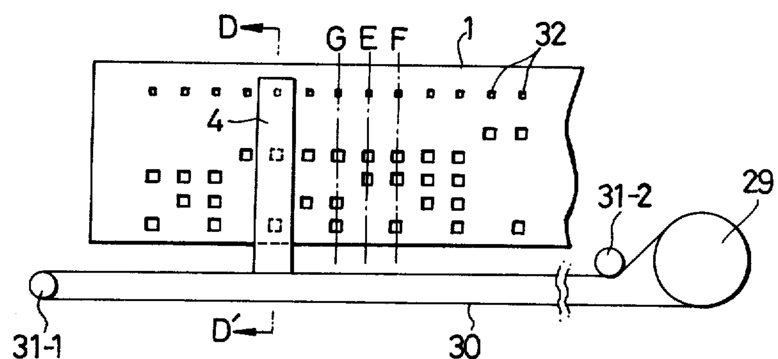
FIG. 3(*a*) is a front view showing a part of a digital tuning section according to this invention.
Figure 3B:
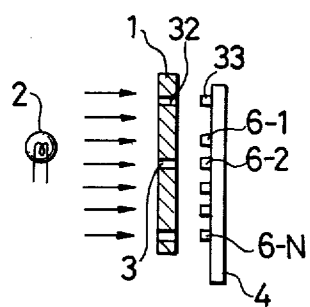
Figure 4:
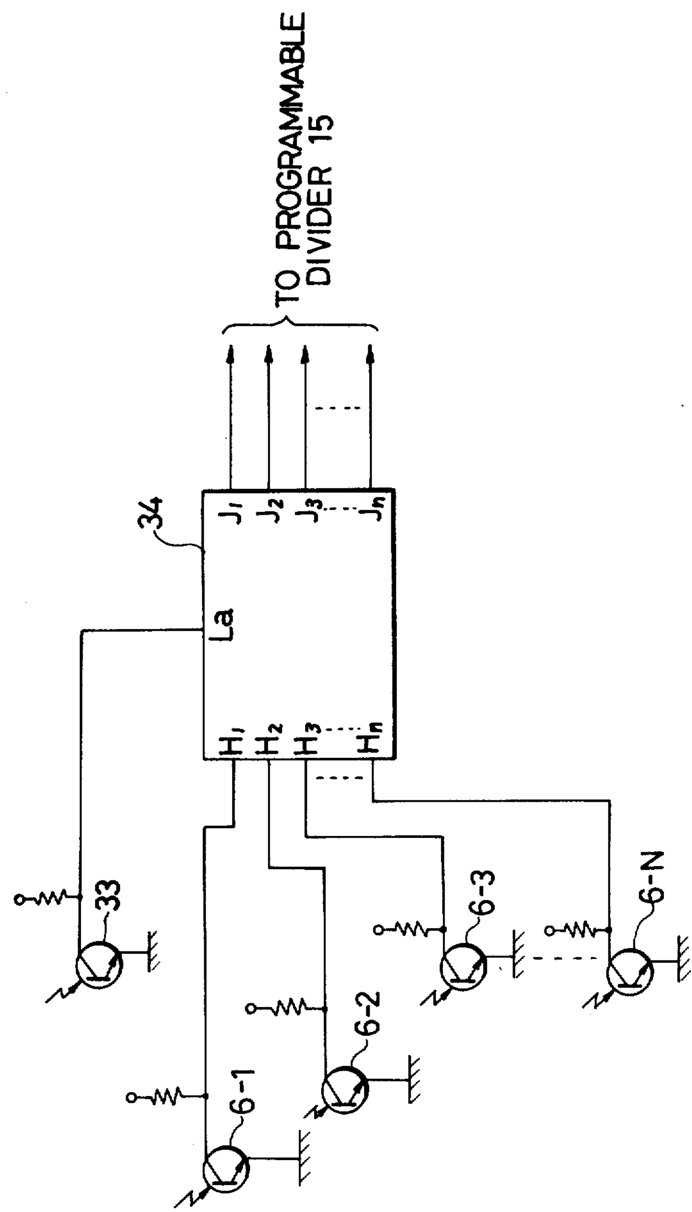
FIG. 4 is a circuit diagram for a description of the operation of a latch circuit and a muting means employed in the FM stereophonic receiver according to this invention.

FIGS. 3(*a*) and 3(*b*) illustrate an arrangement for forming a digital code consisting of several bits to be applied to the programmable frequency divider 15. The arrangement comprises a digital code storing perforated board 1, a light source 2, perforations 3, a photo-transistor holder 4, and photo-transistors 6-1 through 6-N. These elements are similar to those shown in FIG. 1, and therefore the detailed description is not necessary.

A manual tuning knob 29 has a dial thread 30 wound on it and the thread is laid over pulleys 31-1 and 31-2 below the perforated board 1. The photo-transistor holder 4, used also as the dial pointer, is secured to the dial thread 30. Therefore, as the manual tuning knob 29 is rotated, the holder 4 is moved right or left over the perforated board 1. As shown in FIGS. 3(*a*) and 3(*b*) auxiliary perforations 32 are formed in the perforated board 1 in addition to the above-described perforations 3. The perforations 32 are smaller than the perforations 3. The auxiliary perforations 32 are laterally disposed on one straight line in the upper portion of the perforated board 1 to be in alignment with the vertically arranged perforations 3, respectively. A photo-transistor 33 for sensing light from the light source, which has passed through the auxiliary perforations 32, is provided on the photo-transistor holder 4 in addition to the phototransistors 6-1 through 6-N.

With the above-described arrangement, the digital tuning operation according to this invention will next be described with reference to FIG. 4. The output of the photo-transistor 33 is employed as the latch signal information of a latch circuit 34. More specifically, the outputs of the photo-transistors 6-1 through 6-N are connected to the input terminals $H_1$ through $H_n$ of the latch circuit 34 and the output of the photo-transistor 33 corresponding to the auxiliary perforation 32 is connected to the latch control terminal $L_a$ of the latch circuit 34. In the latch circuit 34, a digital signal which has been applied to the input terminals $H_1$ through $H_n$ is held to be applied to the output terminals $J_1$ through $J_n$ thereof until a signal is applied to its latch control terminal $L_a$.

Upon application of the signal to the latch control terminal $L_a$, the digital signal which has been held is erased, and a digital signal which is subsequently applied to the input terminal $H_1$ through $H_n$ is read out and immediately applied to the output terminals $J_1$ through $J_n$. More specifically, a digital code obtained at the position (or line) E is held until the photo-transistor holder 4 is moved to the position F or G. The digital signal corresponding to the perforations F or G is not applied to the input terminals $H_1$ through $H_n$ until the information from the auxiliary perforation 32 on the line of F or G is received. Accordingly, difficulties such as when the holder 4 is between the positions E and F or between the positions E and G, all the bits of the digital code are set to the "L" level, or both of the adjacent digital codes are inputted can be completely eliminated according to this invention.

Next, the muting operation utilizing the output of the auxiliary photo-transistor 33 will be described. When the photo-transistor holder 4 is moved by rotating the manual tuning knob 29 to, for instance, the lines G, E and F where digital codes are provided, light from the light source 2 can pass through the auxiliary perforation 32 as described. As a result, the photo-transistor 33 is turned on, activating the switch circuit 28 to energize the relay coil 26, so that the muting switches 24L and 24R are closed. When the holder 4 is placed, for instance, between the lines G and E (or E and F) where no digital code to be applied to the programmable frequency divider 15 is provided, the light from the light source 2 is intercepted by the perforated board 1. As a result, the photo-transistor 33 is turned off, and in contrast to the above-described case, the muting switches 24L and 24R are opened; therefore, the receiver is maintained in muting state.

Figure 1A:
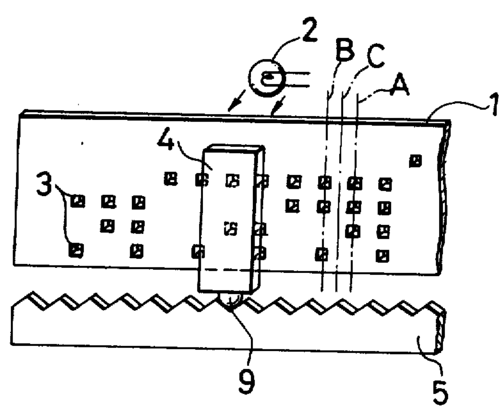
FIGS. 1(*a*) and 1(*b*) are a front view and a side view showing a part of a conventional digital tuning section.
Figure 1B:
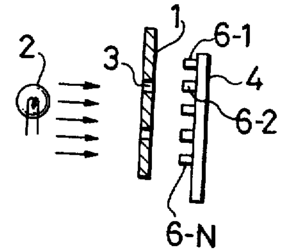

As is clear from the foregoing description, according to this invention, the digital code can be correctly read out, and it is unnecessary to provide a click board as shown in prior art FIG. 1. Therefore, the tuning operation can be carried out easily and smoothly similarly to a conventional receiver using a variable capacitor. Furthermore, only when the digital code is applied to the programmable frequency divider 15 the muting acting is released. When the sensor is placed between adjacent codes, the muting action can be correctly accomplished. Therefore, the reliability of the muting operation of the receiver of this type can be significantly improved.

It is apparent that variations of this invention are possible without departing from the essential scope of this invention.

What is claimed is:

1. In a digital tuning FM stereophonic receiver of the type including a programmable frequency divider employed in a phase locked loop synthesizer wherein a digital code is provided in order to determine a frequency division number of said programmable frequency divider, the improvement comprising:

(a) coded means carrying a plurality of arrays of code-indicating indicia;

(b) first detecting means for detecting the digital code represented by each array of indicia when in alignment therewith;

(c) latch means for storing the detected digital code in response to a latch control signal, the output of said latch means being connected to said programmable frequency divider, and the stored digital code remaining in said latch until a subsequent latch control signal is received;

(d) alignment indicating means carried on said coded means;

(e) second detecting means for providing an alignment output signal when aligned with said alignment indicating means, an alignment output signal from said second detecting means indicating that said first detecting means is aligned with one of said arrays of code-indicating indicia; and (f) means for generating said latch control signal in response to said alignment output signal.

2. A digital tuning FM stereophonic receiver as defined in claim 1 further comprising a muting means operable in response to said alignment output signal.

3. A digital tuning FM stereophonic receiver as defined in claim 1 or 2 wherein said first and second detecting means comprise photo-transistors.

4. A digital tuning FM stereophonic receiver as defined in claim 2 wherein said muting circuit comprises gate means and wherein said gate means is closed in response to said alignment output signal to permit the output of said FM stereophonic receiver to be reproduced.

5. A digital tuning FM stereophonic receiver as defined in claim 3 wherein said first detecting means comprises an array of photo-transistors for detecting said digital code and said second detecting means comprises an auxiliary photo-transistor for detecting the alignment of said array of photo-transistors with one of said arrays of indicia.

6. A digital tuning FM stereophonic receiver as defined in claim 5 wherein said coded means comprises a perforated board, further comprising a light source disposed on a side of said board and said photo-transistors disposed on the opposite side of said board.

7. A digital tuning FM stereophonic receiver as defined in claim 6 wherein said array of photo-transistors and said auxiliary photo-transistors are mounted on a holder, further comprising means for uniformly moving said holder to scan said perforated board.

8. A digital tuning FM stereophonic receiver as defined in claim 6, wherein each said array of code-indicating indicia comprises a row of perforations in said coded means and said indicating alignment means comprises an alignment perforation adjacent each said row of perforations.

9. A digital tuning FM stereophonic receiver as defined in claim 8, wherein said alignment perforations are smaller then the perforations in each said row.

10. A digital tuning FM stereophonic receive defined in claim 9, wherein a single light source is used to illuminate both said alignment perforation and its adjacent row of perforations.

* * * * *